(12) United States Patent
Taruki et al.

(10) Patent No.: US 11,362,129 B2
(45) Date of Patent: Jun. 14, 2022

(54) SOLID-STATE IMAGING DEVICE

(71) Applicants: Kabushiki Kaisha Toshiba, Minato-ku (JP); Toshiba Electronic Devices & Storage Corporation, Minato-ku (JP)

(72) Inventors: Hisayuki Taruki, Kawasaki (JP); Yutaka Okada, Yokohama (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 375 days.

(21) Appl. No.: 16/561,947

(22) Filed: Sep. 5, 2019

(65) Prior Publication Data

US 2020/0273903 A1 Aug. 27, 2020

(30) Foreign Application Priority Data

Feb. 27, 2019 (JP) .............................. JP2019-034781

(51) Int. Cl.
*H01L 27/146* (2006.01)
*H01L 27/148* (2006.01)

(52) U.S. Cl.
CPC .. *H01L 27/14638* (2013.01); *H01L 27/14812* (2013.01); *H01L 27/14825* (2013.01)

(58) Field of Classification Search
CPC ..................... H01L 27/14812; H01L 27/14825
See application file for complete search history.

(56) References Cited

U.S. PATENT DOCUMENTS

| 5,521,405 A * | 5/1996 | Nakashiba .......... H01L 29/1062 257/221 |
| 5,760,430 A * | 6/1998 | Kato ................. H01L 27/14831 257/236 |
| 2017/0229501 A1* | 8/2017 | Takagi .............. H01L 27/14609 |

FOREIGN PATENT DOCUMENTS

| JP | 9-107504 A | 4/1997 |
| JP | 2002-158346 A | 5/2002 |
| JP | 4645764 B2 | 3/2011 |

* cited by examiner

*Primary Examiner* — Thanh Luu
(74) *Attorney, Agent, or Firm* — Oblon, McClelland, Maier & Neustadt, L.L.P.

(57) ABSTRACT

A solid-state imaging device of an embodiment includes plural first transfer gate electrodes, plural second transfer gate electrodes, and plural fixed gate electrodes. The first transfer gate electrodes are such that the respective first transfer gate electrodes are placed in a charge transfer unit to correspond to single light receiving sections, and a control signal $\phi 1$ is applied. The second transfer gate electrodes are such that the respective second transfer gate electrodes are placed in a charge transfer unit to correspond to the single light receiving sections, and a control signal $\phi 2$ that differs in phase from the control signal $\phi 1$ for transferring plural charges is applied. The respective fixed gate electrodes are such that the respective fixed gate electrodes are placed between the first and the second transfer gate electrodes corresponding to the single light receiving sections in the charge transfer unit, and a fixed voltage is applied.

9 Claims, 9 Drawing Sheets

SOLID-STATE IMAGING DEVICE

CROSS-REFERENCE TO RELATED APPLICATIONS

This application is based upon and claims the benefit of priority from the prior Japanese Patent Application No. 2019-34781 filed in Japan on Feb. 27, 2019; the entire contents of which are incorporated herein by reference.

FIELD

Embodiments herein relate generally to a solid-state imaging device.

BACKGROUND

Conventionally, a solid-state imaging device such as a CCD (charge coupled device) image sensor has a charge transfer unit for performing transfer of electric charges that are photoelectrically converted in light receiving sections in response to light receiving amounts. The charge transfer unit has a transfer channel that is formed on a surface layer of a silicon substrate of the solid-state imaging device, and has a plurality of transfer gate electrodes that are provided on the transfer channel. Further, in a part under the respective transfer gate electrodes, a barrier region that configures a potential barrier having a different potential from the potential of the transfer channel is formed.

Control signal lines of pulse signals $\phi 1$ and $\phi 2$ for transfer drive that are supplied from outside, for example, are alternately connected to the plurality of transfer gate electrodes which are arranged side by side in a line. The pulse signals $\phi 1$ and $\phi 2$ which mutually have opposite phases are given to the plurality of transfer gate electrodes, and thereby a plurality of charges under the plurality of transfer gate electrodes are transferred along the transfer channel in the charge transfer unit. A maximum charge amount that can be accumulated under the transfer gate electrode is specified by a potential difference formed under the transfer gate electrode and a channel capacity. For the purpose of high image quality, large maximum charge amount that can be accumulated under the transfer gate electrode, that is, a saturation charge amount, is, better.

However, if an impurity concentration of the transfer channel is changed to increase the potential difference under the transfer gate electrode, the potential difference from an adjacent transfer gate electrode at a time of the pulse signal being applied decreases, and transfer failure is likely to occur.

Further, when the area of the transfer gate electrode is increased to increase the saturation charge amount, increase in chip size of the entire solid-state imaging element, increase in dark current, and reduction in charge transfer speed due to increase in load capacity of the control signal line occur. The applied voltage to the transfer gate electrode can be increased to keep the charge transfer speed, but the power consumption increases.

DETAILED DESCRIPTION

A solid-state imaging device of an embodiment is a solid-state imaging device including a plurality of light receiving sections, and a charge transfer unit configured to transfer a plurality of charges that are generated in the plurality of light receiving sections, and includes a plurality of first transfer gate electrodes with the respective first transfer gate electrodes placed in the charge transfer unit to correspond to the single light receiving sections, and a first control signal applied, a plurality of second transfer gate electrodes with the respective second transfer gate electrodes placed in the charge transfer unit to correspond to the single light receiving sections, and a second control signal different in phase from the first control signal applied, and a plurality of first fixed gate electrodes with the respective first fixed gate electrodes placed between the respective first transfer gate electrodes and the respective second transfer gate electrodes corresponding to the single light receiving sections in the charge transfer unit, and a first fixed voltage applied.

Hereinafter, embodiments will be described in detail with reference to the drawings.

First Embodiment (Configuration)

Figure 1:
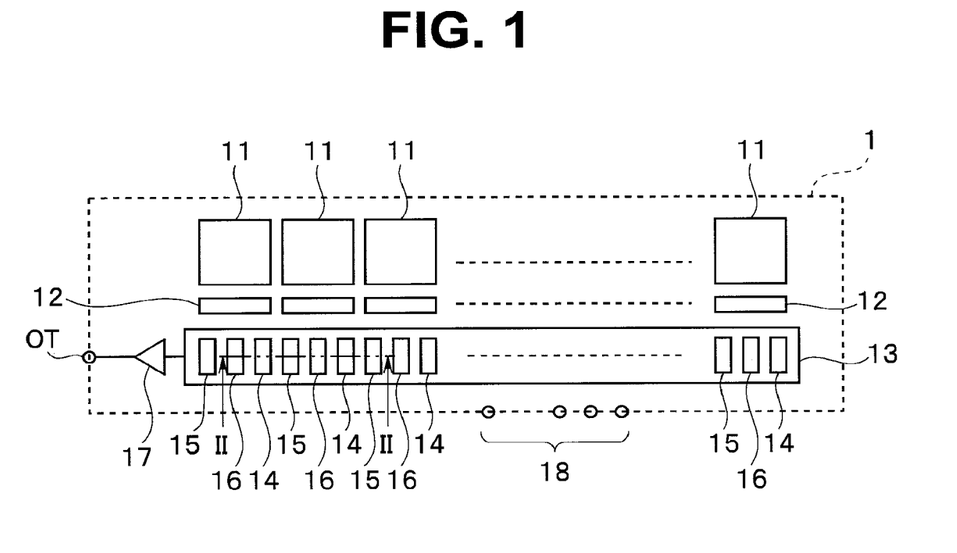
FIG. 1 is a schematic configuration diagram of a linear image sensor according to a first embodiment.

FIG. 1 is a schematic configuration diagram of a linear image sensor 1 according to the present embodiment. FIG. 1 is a plan view of the linear image sensor 1. The linear image sensor 1 includes a plurality of light receiving sections 11 which are pixels, a plurality of shift sections 12, a charge transfer unit 13, and an output section 17. The linear image sensor 1 is used in, for example, a copying machine, and a scanner apparatus.

The plurality of light receiving sections 11 are placed in a straight line on a p-type semiconductor silicon substrate.

The respective light receiving sections 11 are configured by the p-type semiconductor silicon substrate, and photodiodes by pn junction of n-type wells on a surface layer of the p-type semiconductor silicon substrate. The plurality of shift sections 12 shift, that is, transfer a plurality of charges from the plurality of light receiving sections 11 to the charge transfer unit 13. The respective shift sections 12 are provided adjacently to the corresponding light receiving sections 11. Each of the shift sections 12 includes an n-type channel region for shift formed in the silicon semiconductor substrate, and a gate electrode for shift provided on the channel region. The respective shift sections 12 transfer the charges of the corresponding light receiving sections 11 to the charge transfer unit 13.

In other words, the linear image sensor 1 which is a solid-state imaging device includes the plurality of light receiving sections 11 arranged in a predetermined direction, and the charge transfer unit 13 configured to transfer a plurality of charges which are generated in the plurality of light receiving sections 11. The plurality of shift sections 12 that shift, that is, transfer the plurality of charges to the charge transfer unit 13 from the plurality of light receiving sections 11 are provided between the plurality of light receiving sections 11 and the charge transfer unit 13.

An imaging region is configured by the plurality of light receiving sections 11 and the plurality of shift sections 12. The plurality of light receiving sections 11 and the plurality of shift sections 12 are formed in a first conductive type, for example, p-type silicon semiconductor substrate. Each of the light receiving sections 11 includes an impurity diffusion region for an n-type well, for example. Each of the shift sections 12 includes an n-type impurity diffusion region in the p-type silicon substrate, for example.

The charge transfer unit 13 transfers charges from the plurality of shift sections 12 serially, and outputs the charges to the output section 17. The charge transfer unit 13 has a plurality of transfer sections corresponding to the respective light receiving sections 11, and each of the transfer sections includes two transfer gate electrodes 14 and 15.

A fixed gate electrode 16 is provided between the two transfer gate electrodes 14 and 15. The charge transfer unit 13 is provided in parallel with arrangement of the plurality of light receiving sections 11. The charge transfer unit 13 has a CCD image sensor structure. As illustrated in FIG. 1, a plurality of transfer gate electrodes 14 and 15, and a plurality of fixed gate electrodes 16 are placed along the arrangement of the plurality of light receiving sections 11.

The output section 17 amplifies a charge and outputs an output signal. The output section 17 is connected to an output of the charge transfer unit 13, and the output signal of the output section 17 is a voltage signal, and is outputted from an output terminal OT of the linear image sensor 1.

The linear image sensor 1 includes a terminal section 18 to which various control signals and the like from circuits such as an external timing generator are inputted. The terminal section 18 includes a terminal for the control signal $\phi 1$ that is a pulse signal which is supplied to the transfer gate electrode 14, a terminal for the control signal $\phi 2$ that is a pulse signal which is supplied to the transfer gate electrode 15, and a terminal for a fixed voltage that is supplied to the fixed gate electrode 16.

Figure 2:
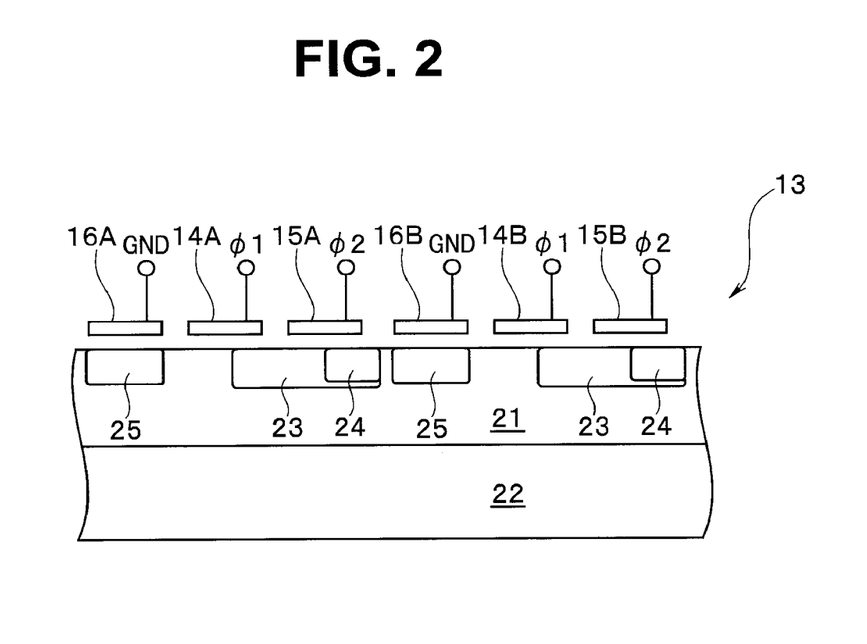
FIG. 2 is a schematic partial sectional diagram of a charge transfer unit of the linear image sensor according to the first embodiment.

FIG. 2 is a schematic partial sectional diagram of the charge transfer unit 13 of the linear image sensor 1. FIG. 2 illustrates a section of the charge transfer unit 13 along line II-II shown by a two-dot chain line in FIG. 1. FIG. 2 illustrates a part corresponding to the two adjacent light receiving sections 11 in the charge transfer unit 13.

The charge transfer unit 13 has a channel region 21 for charge transfer. The channel region 21 is an n-type CCD image sensor embedded channel formed on a surface layer of a p-type silicon substrate 22. On the channel region 21, the plurality of transfer gate electrodes 14 which apply the control signal $\phi 1$, the plurality of transfer gate electrodes 15 which apply the control signal $\phi 2$, and the plurality of fixed gate electrodes 16 which apply a ground (GND) potential as the fixed voltage are formed. As illustrated in FIGS. 1 and 2, three gates of the transfer gate electrodes 14 and 15 and the fixed gate electrode 16 are provided to correspond to the respective light receiving sections 11.

In other words, the plurality of transfer gate electrodes 14 are placed in the charge transfer unit 13 with the respective transfer gate electrodes 14 corresponding to the single light receiving sections 11, and the control signal $\phi 1$ for transfer for transferring a plurality of charges is applied to the respective transfer gate electrodes 14. The plurality of transfer gate electrodes 15 are also placed in the charge transfer unit 13 with the respective transfer gate electrodes 15 corresponding to the single light receiving sections 11, and the control signal $\phi 2$ for transfer which differs in phase from the control signal $\phi 1$ for transferring a plurality of charges is applied to the respective transfer gate electrodes 15.

As for the plurality of fixed gate electrodes 16, the respective fixed gate electrodes 16 are placed between the respective first transfer gate electrodes 14 and the respective second transfer gate electrodes 15 that correspond to the single light receiving sections 11 in the charge transfer unit 13, and the fixed voltage is applied to the respective fixed gate electrodes 16.

Note that in FIG. 2, in order to distinguish the two transfer gate electrodes 14, the transfer gate electrodes 14 are shown as 14A and 14B. In order to distinguish the two transfer gate electrodes 15, the transfer gate electrodes 15 are shown as 15A and 15B. In order to distinguish the two fixed gate electrodes 16, the fixed gate electrodes 16 are shown as 16A and 16B.

In a part including a part under the transfer gate electrode 14 and a substantially entire part under the transfer gate electrode 15, a channel region 23 different in potential from the channel region 21 is formed.

In a part under the transfer gate electrode 15, a channel region 24 different in potential from the channel regions 21 and 23 is formed. Under the fixed gate electrode 16, a channel region 25 different in potential from the channel regions 21, 23 and 24 is formed.

Acceptor ions are implanted into the channel regions 23 and 24. Donner ions are implanted into the channel region 25. These acceptor ions and dormer ions are implanted so that the potential of the channel region 25 under the fixed gate electrode 16 becomes deepest when the transfer gate electrodes 14 and 15 are brought to the ground (GND) voltage.

As above, the potentials under the respective transfer gate electrodes 14 and the potentials under the respective transfer gate electrodes 15 are specified by ion implantation into the impurity diffusion regions under the respective transfer gate electrodes 14 and the respective transfer gate electrodes 15.

Note that in order to perform charge transfer smoothly, impurity concentrations of the respective channel regions are set so that the potential of the channel region 25 becomes shallower than the potential of the channel region 24 at a time of a high voltage being applied to the transfer gate electrode 15.

In this case, the potential of the channel region 25 under the fixed gate electrode 16 is set by implanting the dormer ions into the channel region 25 under the fixed gate electrode 16, but instead, the same potential may be set to the channel region 25 by implanting the acceptor ions into the other regions than the region under the fixed gate electrode 16.

In other words, the potentials under the respective fixed gate electrodes 16 are specified by ion implantation into the impurity diffusion regions under the respective fixed gate electrodes 16, or the fixed voltage that is applied to the respective fixed gate electrodes 16.

The control signal line to which the control signal φ1 which is a pulse signal is supplied is connected to the transfer gate electrode 14. The control signal line to which the control signal φ2 is supplied is connected to the transfer gate electrode 15. A ground line to which the ground voltage (GND) is supplied is connected to the fixed gate electrode 16.

Figure 3:
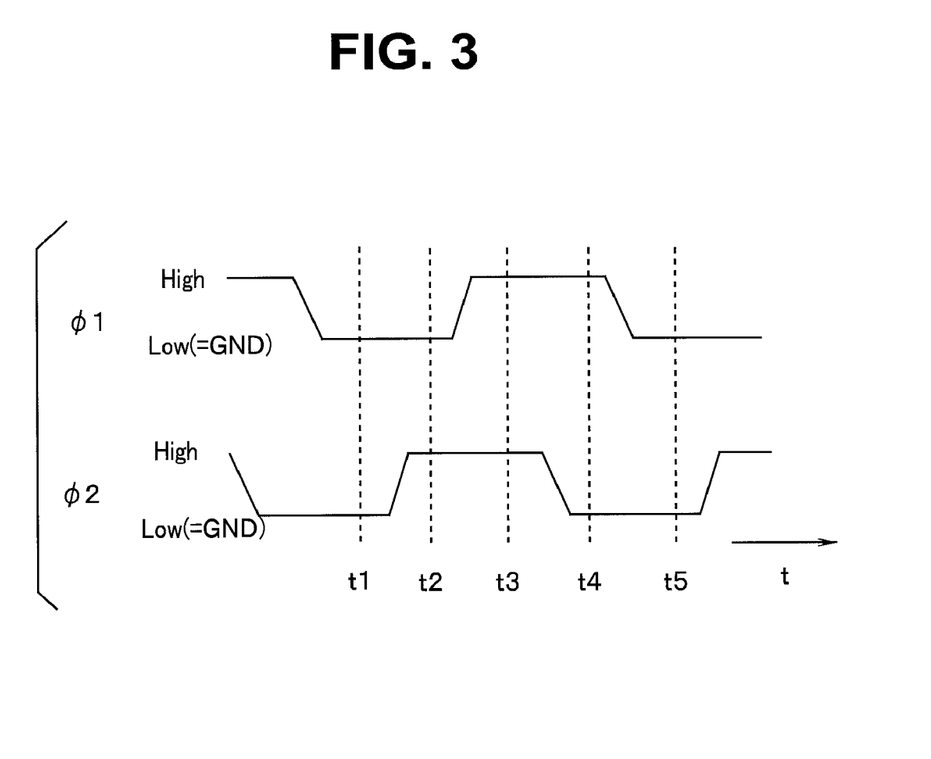
FIG. 3 is a waveform diagram of control signals $\phi 1$ and $\phi 2$ that are given to a transfer gate electrode, according to the first embodiment.

FIG. 3 is a waveform diagram of the control signals φ1 and φ2 which are given to the transfer gate electrodes 14 and 15. The control signals φ1 and φ2 have a high voltage and a low voltage. Here, the low voltage is the ground (GND) voltage. As illustrated in FIG. 3, the control signal φ1 is shifted to be delayed by approximately ¼ phase with respect to the control signal φ2.

(Operation)

Next, an operation of the charge transfer unit of the present embodiment will be described.

Figure 4:
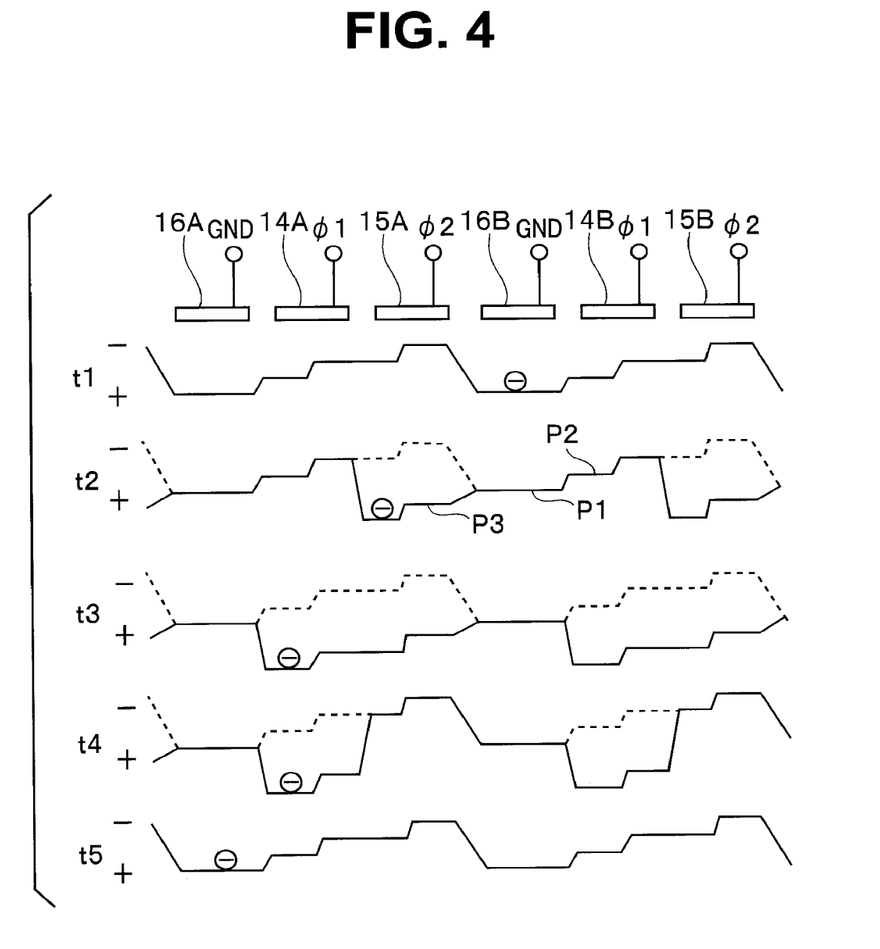
FIG. 4 is a diagram illustrating a change of a potential distribution of the charge transfer unit along time series, according to the first embodiment.

FIG. 4 is a diagram illustrating a change of a potential distribution of the charge transfer unit 13 along time series. Respective times t1 to t5 in FIG. 4 correspond to times t1 to t5 shown in FIG. 3, and FIG. 4 illustrates states of a potential in the respective times t1 to t5. Here, charges are electrons, so that in vertical directions of the respective potential distributions, an upper direction is a minus direction and a lower direction is a plus direction.

At the time t1, the control signals φ1 and φ2 are both low (GND). Therefore, a potential distribution of the charge transfer unit 13 at the time t1 is a distribution formed by the acceptor ions and the dormer ions which are implanted into the channel regions 23, 24 and 25. At this time, a potential under the transfer gate electrode 15 is shallowest, and a potential under the fixed gate electrode 16B is deepest, so that a charge transferred from the corresponding light receiving section 11 stays in the channel region 25 under the fixed gate electrode 16B, for example.

At the time t2, the control signal φ1 is low (GND), and the control signal φ2 is high, so that potentials in a part of the channel region 23 and a part of the channel region 24 under the transfer gate electrode 15 are deeper than the potential of the channel region 25. In other words, in FIG. 4, a height of a potential barrier under the transfer gate electrode 15A is lowered. Therefore, the signal charge located in the channel region 25 under the fixed gate electrode 16B in the time t1, for example, is transported to the channel region 23 under the transfer gate electrode 15A at the time t2.

At this time, a potential P1 under the respective fixed gate electrodes 16 is deeper than a potential P2 under the transfer gate electrode 14 to which the low control signal φ1 is applied, and is shallower than a potential P3 under the transfer gate electrode 15 to which the high control signal φ2 is applied.

At the time t3, the control signals φ1 and φ2 both become high, so that the potentials in a part of the channel region 21 and in a part of the channel region 23 under the transfer gate electrode 14 become deeper than the potential under the transfer gate electrode 15. In other words, in FIG. 4, a height of a potential barrier under the transfer gate electrode 14A is lowered. Therefore, the signal charge located under the transfer gate electrode 15A at the time t2 is transported to the channel region 21 under the transfer gate electrode 14A at the time t3.

At the time t4, the control signal φ1 becomes high, and the control signal φ2 becomes low, so that potentials in a part of the channel region 23 and in a part of the channel region 24 under the transfer gate electrode 15 become shallower than the potential under the fixed gate electrode 16. In other words, in FIG. 4, the height of the potential barrier under the transfer gate electrode 15A rises. Note that the signal charge located under the transfer gate electrode 14A at the time t3 still stay in the channel region 21 under the transfer gate electrode 14A at the time t4.

At the time t5, the control signals φ1 and φ2 are both low (GND). Therefore, the signal charge located under the transfer gate electrode 14A at the time t4, for example, is transported to the channel region 25 under the fixed gate electrode 16A.

The aforementioned operation is repeated, whereby the respective charges which are transferred from the respective light receiving sections 11 are transferred in the charge transfer unit 13, and are outputted to the output section 17.

As above, in the aforementioned charge transfer unit 13, some of the conventional transfer gate electrodes are replaced with the fixed gate electrodes 16 which are fixed to the fixed potential (ground in this case), so that a gate area which is driven is decreased, and a load capacity of the control signal line can be decreased. In the aforementioned example, the number of gate electrodes corresponding to the single light receiving section 11 is three including the fixed electrode, so that the area of the respective transfer gates is ⅔ of the conventional area. Consequently, according to the aforementioned charge transfer unit 13, charge transfer at a higher speed with lower power consumption is enabled.

Further, a hole concentration in an interface of a silicon semiconductor substrate increases more when a low voltage is applied to the transfer gate electrodes 14 and 15 than when a high voltage is applied to the transfer gate electrodes 14 and 15, so that according to the aforementioned configuration in which the fixed gate electrode 16 is fixed to the ground, a dark current that occurs under the fixed gate electrode 16 is suppressed, and as a result, occurrence of a dark current in the entire charge transfer unit 13 is suppressed.

Furthermore, as described above, by applying a fixed voltage higher than the low level of the control signals φ1 and φ2 to the fixed gate electrode 16 without implanting the donor ions to the channel region 25, the same effect as the effect described above can also be obtained without adding a step of ion implantation.

As above, according to the present embodiment, the solid-state imaging device that does not cause reduction in transfer speed of charges while keeping a saturation charge amount without increasing the area of the transfer gate electrodes can be provided.

Second Embodiment

The present embodiment relates to transfer of charges between light receiving sections and a charge transfer unit of a linear image sensor.

(Configuration)

Figure 5:
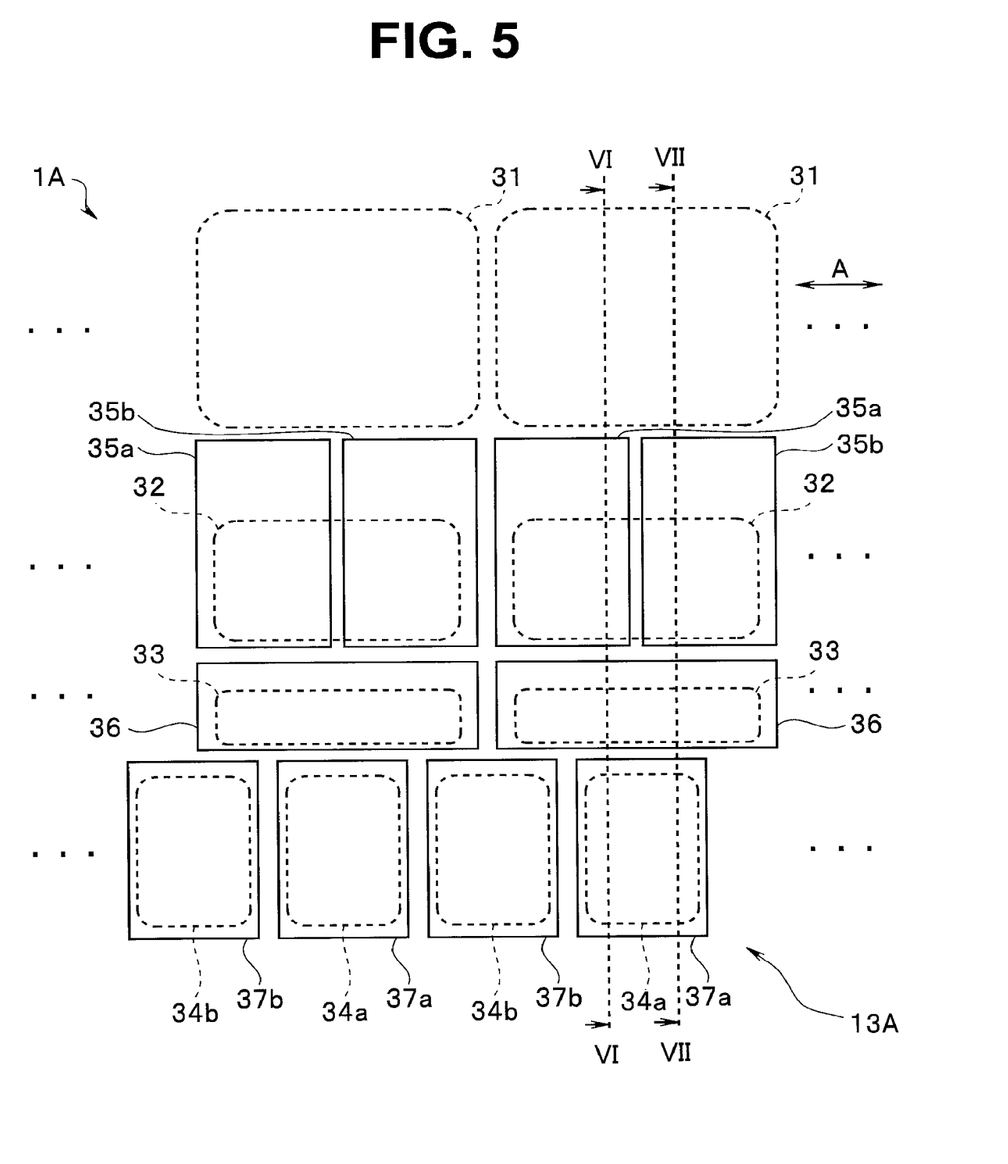
FIG. 5 is a partial plan view of a plurality of light receiving units to the charge transfer unit in a linear image sensor according to a second embodiment.

FIG. 5 is a partial plan view of a plurality of light receiving sections to a charge transfer unit in a linear image sensor 1A according to the present embodiment. The linear image sensor 1A of the present embodiment also has a plurality of light receiving sections that are disposed in a predetermined direction. FIG. 5 illustrates a plurality of channel regions and a plurality of gate electrodes relating to two light receiving sections out of the plurality of light receiving sections.

Figure 6:
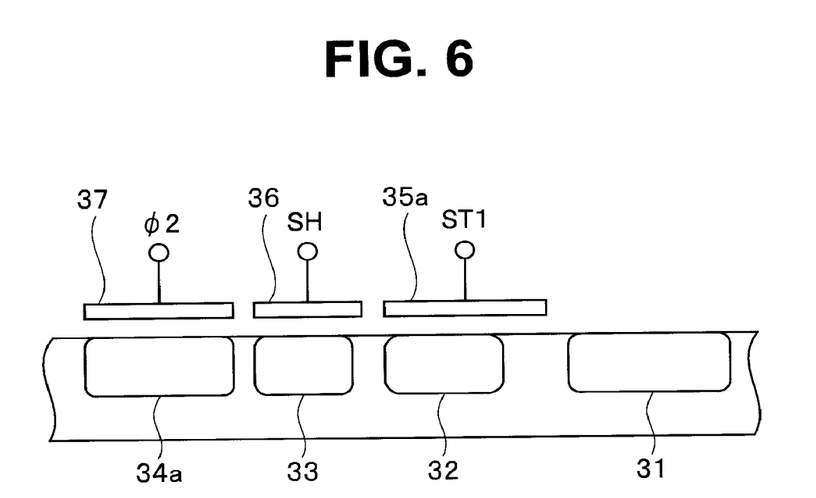
FIG. 6 is a schematic partial sectional view of a linear image sensor along line VI-VI in FIG. 5.
Figure 7:
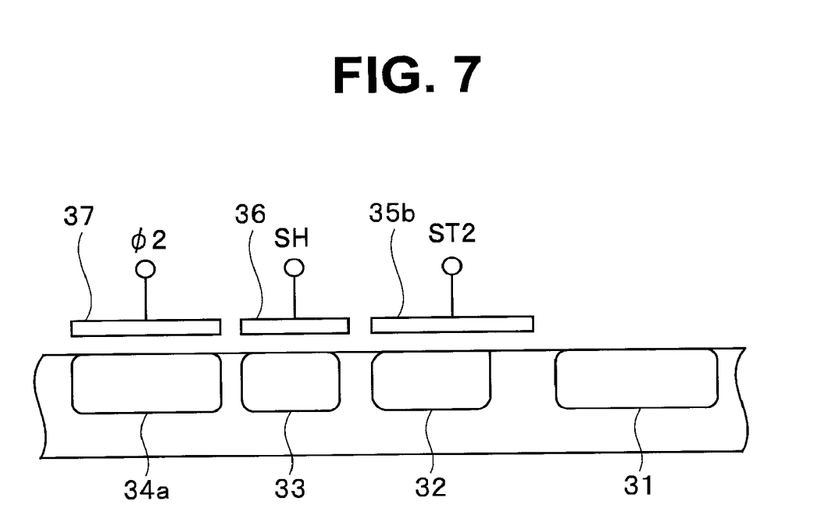
FIG. 7 is a schematic partial sectional view of the linear image sensor along line VII-VII in FIG. 5.

FIG. 6 is a schematic partial sectional diagram of the linear image sensor 1A along line VI-VI in FIG. 5. FIG. 7 is a schematic partial sectional diagram of the linear image sensor 1A along line VII-VII in FIG. 5.

A plurality of photoelectric conversion regions and a plurality of channel regions are formed on a surface layer of a p-type silicon substrate (not illustrated). A plurality of photoelectric conversion regions 31 corresponding to the plurality of light receiving sections are provided along a two-way arrow A as illustrated in FIG. 5. The respective photoelectric conversion regions 31 each configure a light receiving section of photodiode by pn junction of an n-type well and a p-type silicon substrate.

A plurality of storage regions 32 are provided along the two-way arrow A adjacently to the plurality of photoelectric conversion regions 31 as shown by dotted lines. The respective storage regions 32 are channel regions that primarily accumulate charges which are generated in the corresponding photoelectric conversion regions 31. In other words, as illustrated in FIG. 5, the plurality of storage regions 32 accumulate a plurality of charges which are generated in the plurality of photoelectric conversion regions 31 with each of the storage regions 32 placed adjacently to the photoelectric conversion regions 31.

Shift regions 33 are provided along the two-way arrow A adjacently to the respective storage regions 32, as shown by dotted lines. The respective shift regions 33 are channel regions that transport the charges accumulated in the corresponding storage regions 32 to a charge transfer unit 13A. In other words, the plurality of shift regions 33 are provided between the plurality of storage regions 32 and the charge transfer unit 13A, and shift, that is, transfer a plurality of charges of the plurality of storage regions 32 to the charge transfer unit 13A.

A plurality of channel regions 34a and 34b that configure the charge transfer unit 13A are provided along the two-way arrow A adjacently to the plurality of shift regions 33 as shown by dotted lines. The channel regions 34a and 34b are placed alternately to one another.

Impurity ions are implanted into the storage regions 32 and the shift regions 33 so that potentials in the storage regions 32 and the shift regions 33 are caused to differ from potentials of the channel regions 34a and 34b. In the channel regions 34a and 34b, potential barriers are generated, and impurity ions for charge transfer are implanted.

On each of the storage regions 32, two storage gate electrodes 35a and 35b as transfer gate electrodes are provided. By the single storage region 32 and the two storage gate electrodes 35a and 35b, a single storage section corresponding to the single photoelectric conversion region 31 is configured. On each of the shift regions 33, a shift gate electrode 36 as a transfer gate electrode is formed. By the single shift region 33 and the single shift gate electrode 36, a single shift section is configured. The storage gate electrodes 35a and 35b are adjacent to the shift region 33, so that by a predetermined control signal SH being applied to the shift gate electrode 36, a path in which charges of the storage region 32 are transferred to the shift region 33 can be formed.

As above, in the plurality of gate electrodes 35a, the respective gate electrodes 35a are provided to correspond to the respective storage regions 32, and a control signal ST1 for accumulating a plurality of charges of the plurality of photoelectric conversion regions 31 in the plurality of storage regions 32 is applied to the plurality of gate electrodes 35a. In the plurality of gate electrodes 35b, the respective gate electrodes 35b are a plurality of fixed gate electrodes that are provided to correspond to the respective storage regions 32, and a fixed voltage is applied to the plurality of gate electrodes 35b.

A transfer gate electrode 37a is provided on the channel region 34a, and a transfer gate electrode 37b is provided on the channel region 34b. The charge transfer unit 13A is configured by the plurality of channel regions 34a and 34b and the plurality of transfer gate electrodes 37a and 37b.

A control signal line is connected to the respective gate electrodes, so that a pulse signal or a fixed voltage is supplied as a control signal as will be described later.

Figure 8:
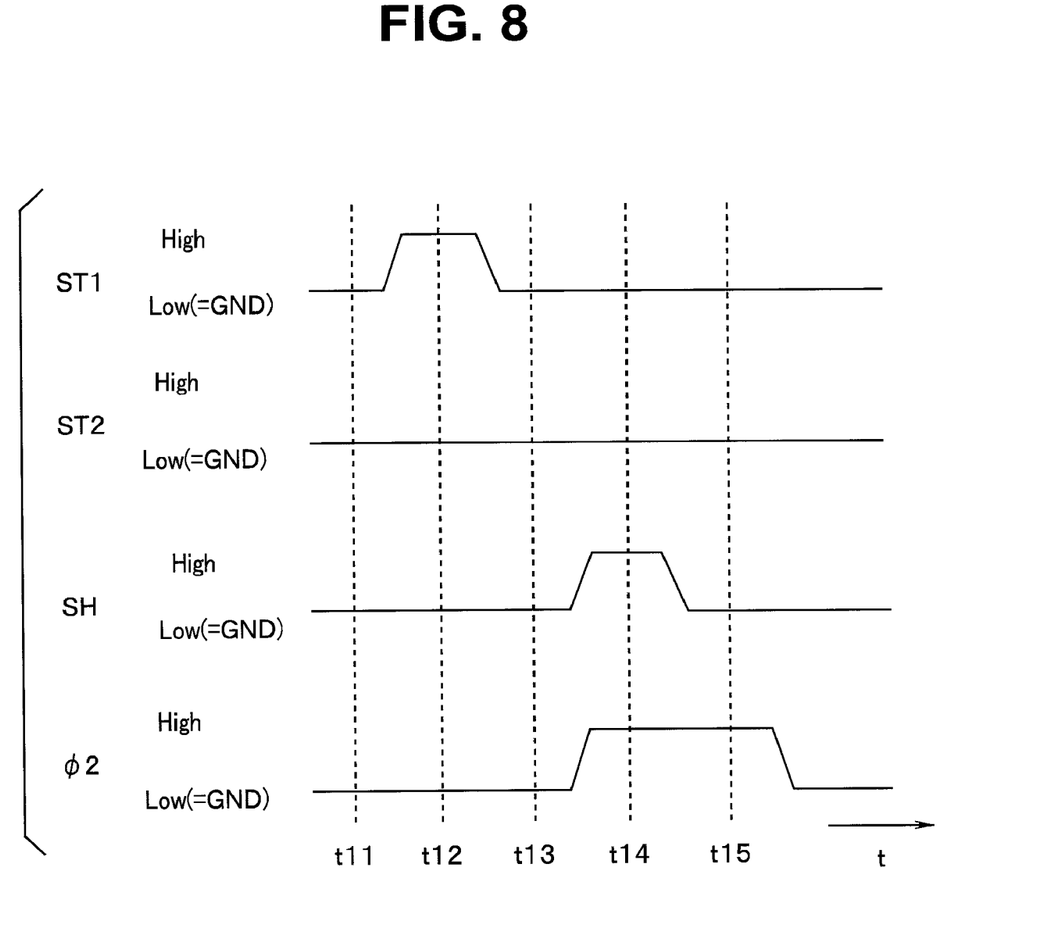
FIG. 8 is a waveform diagram of control signals ST1 and ST2 that are pulse signals which are given to two storage gate electrodes, a control signal SH that is a pulse signal which is given to a shift gate electrode, and a control signal $\phi 2$ that is a pulse signal which is given to a transfer gate electrode, according to the second embodiment.

FIG. 8 is a waveform diagram of the control signal ST1 that is a pulse signal which is given to the storage gate electrode 35a, a control signal ST2 that is a voltage signal which is given to the storage gate electrode 35b, a control signal SH that is a pulse signal which is given to the shift gate electrode 36, and the control signal φ2 that is a pulse signal which is given to the transfer gate electrode 37a.

The storage gate electrode 35a is supplied with the control signal ST1 which is the pulse signal as illustrated in FIG. 8. The storage gate electrode 35b is supplied with the control signal ST2 which is a fixed low voltage signal as illustrated in FIG. 8, the ground (GND) voltage signal in this case. The shift gate electrode 36 is supplied with the control signal SH as illustrated in FIG. 8. The transfer gate electrode 37b is supplied with the control signal φ2 as illustrated in FIG. 8.

Note that although the control signal φ1 that is a pulse signal which is given to the transfer gate electrode 37b is not illustrated here, the control signal φ1 is a signal of an opposite phase to a phase of the control signal φ2 which is a pulse signal, and a period in which the control signal φ2 is high and a period in which the control signal φ1 is high do not overlap each other. By supplying to the transfer gate electrodes 37b and 37a the control signals φ1 and φ2 which are of opposite phases to each other, charges are transferred in the charge transfer unit 13A.

(Operation)

Next, an operation of the charge transfer unit of the present embodiment will be described.

Figure 9:
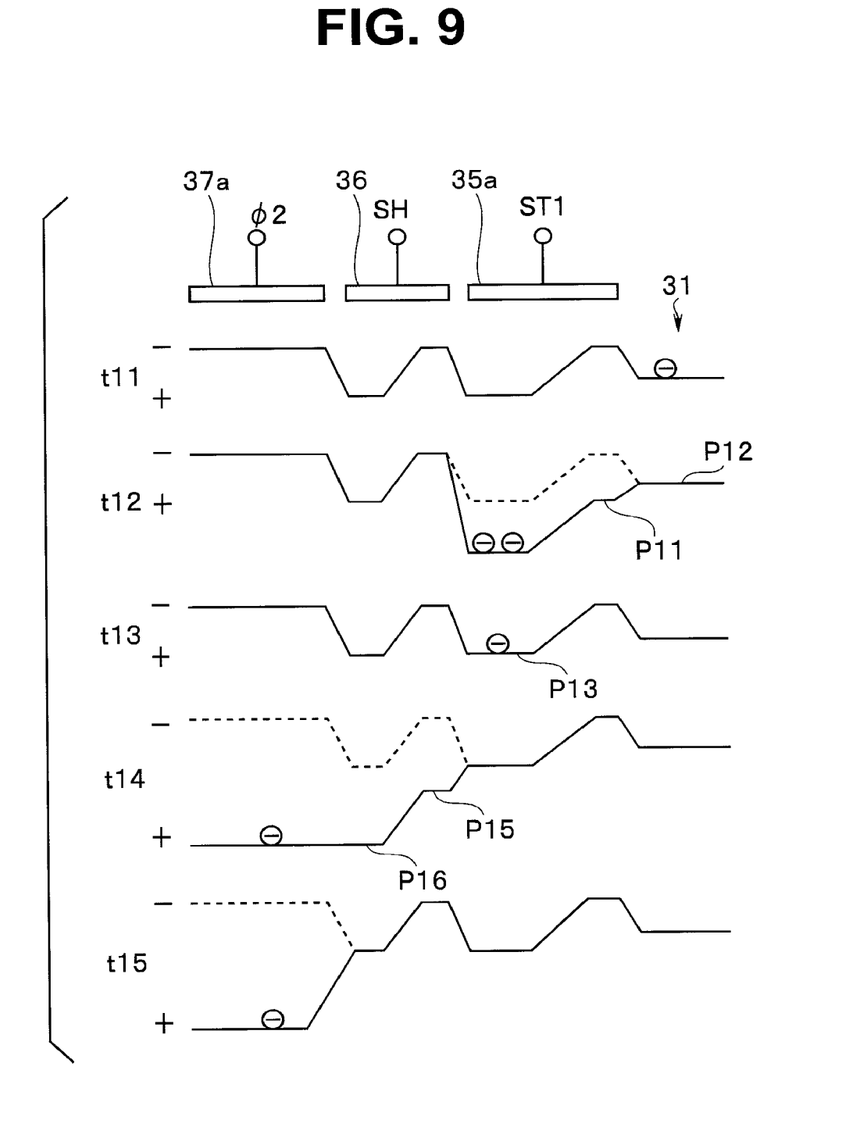
FIG. 9 is a diagram illustrating a change of a potential distribution of a photoelectric conversion region to the charge transfer unit along time series, according to the second embodiment.
Figure 10:
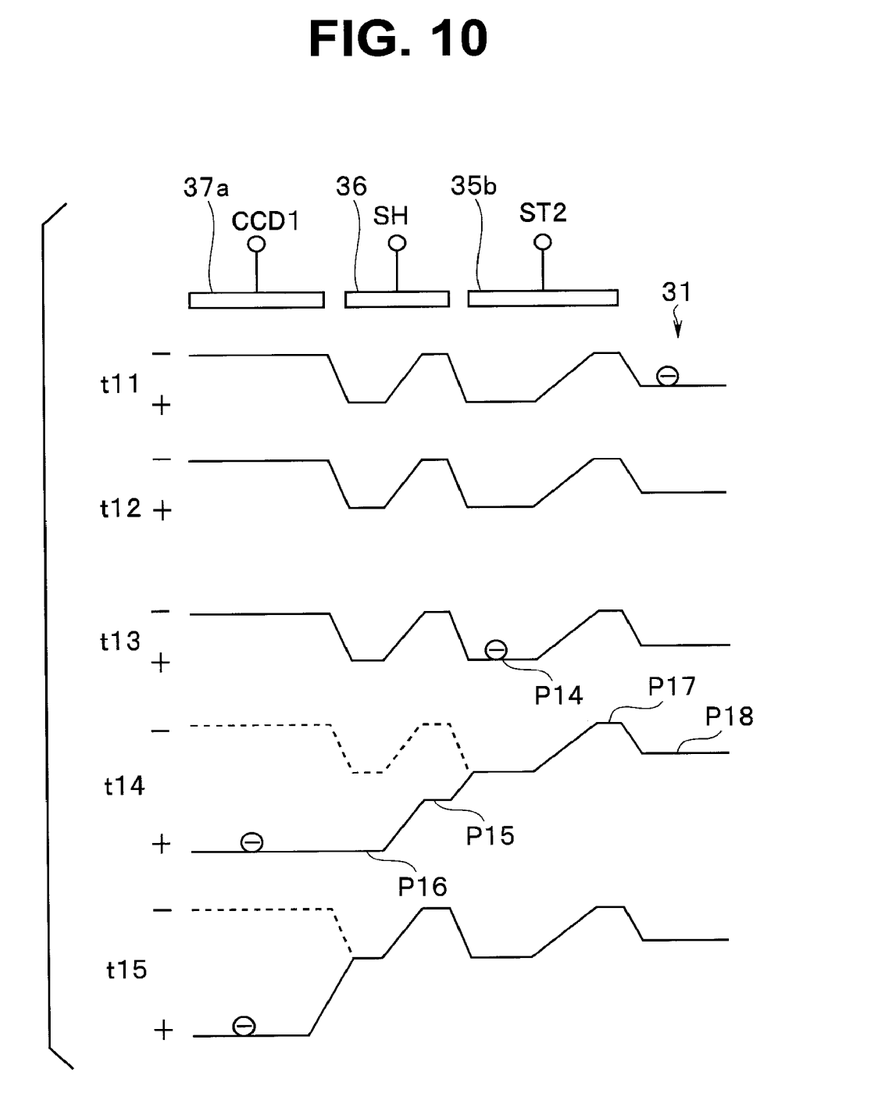
FIG. 10 is a diagram illustrating a change of the potential distribution of the photoelectric conversion region to the charge transfer unit along the time series, according to the second embodiment.

FIGS. 9 and 10 are diagrams illustrating changes of potential distributions of the photoelectric conversion region 31 to the charge transfer unit 13A. Respective times t11 to t15 in FIGS. 9 and 10 correspond to the times t11 to t15 in FIG. 8, and FIGS. 9 and 10 illustrate states of potentials corresponding to the respective times t11 to t15. Here, charges are electrons, so that upper directions are minus directions and lower directions are plus directions in vertical directions of the respective potential distributions.

At the time t11, the respective control signals ST1, ST2, SH and φ2 are all low (GND). Therefore, the potential distribution at the time t11 is a distribution which is formed by impurity ions that are implanted into the storage region 32, the shift region 33, and the channel region 34a. At this time, potentials in the storage region 32 under the storage gate electrodes 35a and 35b, and in the shift region 33 under the shift gate electrode 36 are deep. The potential distribution in the photoelectric conversion region 31 is formed so that charges stay in the photoelectric conversion region 31.

The potentials of the respective storage regions 32 are controlled by the two storage gate electrodes 35a and 35b, so that the potentials under the two storage gate electrodes 35*a* and 35*b* are equal at the time t11.

At the time t12, the control signal ST2 remains low (GND), and the control signal ST1 becomes high, and as illustrated in FIG. 9, the potential under the storage gate electrode 35*a* adjacent to each of the photoelectric conversion regions 31 is deeper than the potential in the photoelectric conversion region 31. As a result, the charges in the respective photoelectric conversion regions 31 are transported to the storage regions 32.

In more detail, a potential P11 in a potential barrier section under the storage gate electrode 35*a* becomes deeper than a potential P12 of the photoelectric conversion region 31, so that the signal charge of the photoelectric conversion region 31 is transported to a part of the storage region 32. In other words, at the time t12, in FIG. 9, a height of the potential barrier under the storage gate electrode 35*a* is lowered, so that the signal charges in the photoelectric conversion region 31 are transported to a part of the storage region 32.

At this time, the storage gate electrode 35*b* remains low. Therefore, a potential barrier exists between the photoelectric conversion region 31 and the storage region 32 under the storage gate electrodes 35*a* and 35*b*.

Consequently, the charge which is transported to the storage region 32 under the storage gate electrode 35*a* at the time t12 is distributed to the storage region 32 under the storage gate electrode 35*b* at the time t13.

At the time t13, the respective control signals ST1, ST2, SH and CCD image sensor 1 are all low (GND). Consequently, the height of the potential barrier under the storage gate electrode 35*a* rises. At the time t13, only the two storage gate electrodes 35*a* and 35*b* are provided on the storage region 32, so that when the control signals ST1 and ST2 are low, a potential P13 in the storage region 32 under the storage gate electrode 35*a* and a potential P14 in the storage region under the storage gate electrode 35*b* are equal.

At the time t14, the control signals ST1 and ST2 remain low, and the control signals SH and φ2 become high, so that the potentials under the shift gate electrode 36 and the transfer gate electrode 37*a* become deep. At this time, a potential barrier under the shift gate electrode 36 is lowered, and a potential P15 in a potential barrier portion under the shift gate electrode 36 is deeper than the potential P13 in the storage region 32 under the storage gate electrode 35*a* and the potential P14 in the storage region 32 under the storage gate electrode 35*b*, and is shallower than a potential P16 in the channel region 34*a* under the transfer gate electrode 37*a*.

In other words, the potential P15 under the respective shift gate electrodes 36 at a time of the high control signal SH being applied is deeper than the potential P13 under the storage gate electrode 35*a* to which the low control signal ST1 is applied and the potential P14 of the storage region 32 under the storage gate electrode 35*b*, and is shallower than the potential P16 under the transfer gate electrode 37*a* of the charge transfer unit 13A at a time of the high control signal φ2 being applied. Therefore, the charges that stay in the storage region 32 under the storage gate electrodes 35*a* and 35*b* are transported to the channel region 34*a* through the shift region 33.

In particular, overflowing charges in the storage region 32 under the storage gate electrode 35*a* also stay in the storage region 32 under the storage gate electrode 35*b*, and therefore the charges are accumulated in a vicinity of the shift region 33 under the shift gate electrode 36, so that high-speed transfer is enabled.

Further, the storage gate electrode is configured by being divided into the two storage gate electrodes 35*a* and 35*b*, and as a result, a load capacity for driving each of the storage gate electrodes 35*a* and 35*b* is small.

Note that in the aforementioned embodiment, the potential P14 under the storage gate electrode 35*b* may be set to be separate and independent from the potential P13 under the storage gate electrode 35*a* if the potential P14 is deeper than a potential P17 of a potential barrier between the photoelectric conversion region 31 and the storage gate electrode 35*b*, and is shallower than the aforementioned potential P15.

In that case, the potential P14 under the storage gate electrode 35*b* can be set at a desired potential by performing ion implantation under the storage gate electrode 35*b*, or by applying another fixed voltage.

Further, by making the potential P14 under the storage gate electrode 35*b* deeper, a saturation charge amount that can be accumulated in the storage region 32 can be increased.

Further, in the present embodiment, the gate area of the storage gate electrode 35*a* decreases, so that a higher speed and lower power consumption are realized, and occurrence of a dark current is suppressed.

As above, according to the aforementioned present embodiment, a load capacity of the control signal line can be decreased while the saturation charge amount is kept, and the charge transfer device at a higher speed with lower power consumption can be realized. Further, reduction in dark current is enabled.

Third Embodiment

In the first embodiment, the fixed gate electrodes to which the fixed voltage is supplied are provided in the charge transfer unit. In the second embodiment, the fixed gate electrodes to which the fixed voltage is supplied are provided between the light receiving sections and the charge transfer unit. However, in a third embodiment, the fixed gate electrodes to which a fixed voltage is supplied are provided not only in the charge transfer unit, but also between the light receiving sections and the charge transfer unit. In other words, the third embodiment includes both the configurations of the first and second embodiments.

Figure 11:
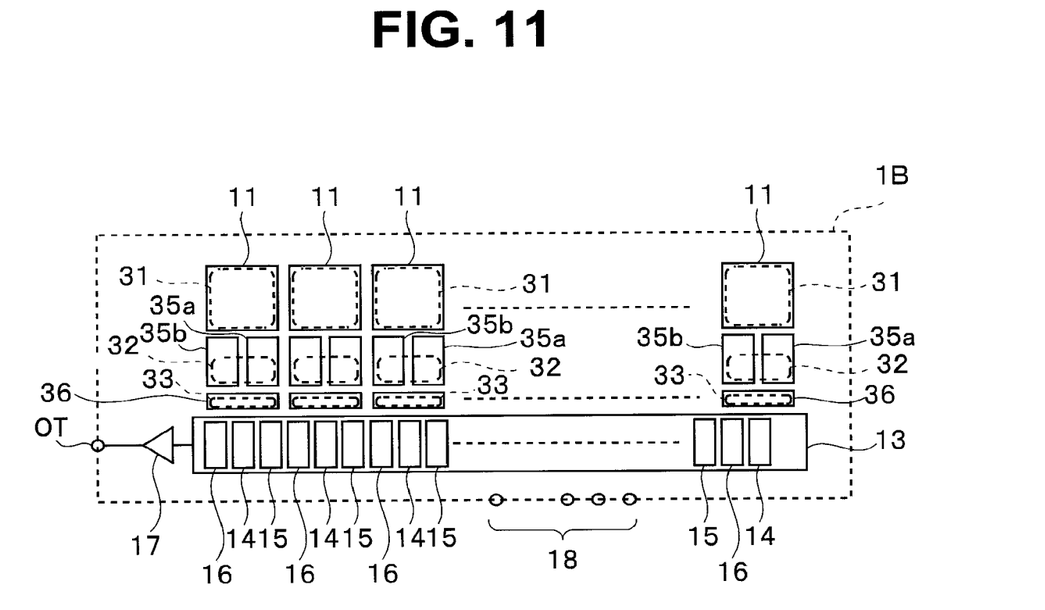
FIG. 11 is a schematic configuration diagram of a linear image sensor according to a third embodiment.

FIG. 11 is a schematic configuration diagram of a linear image sensor 1B according to the present embodiment. In the present embodiment, the same components as the components of the first embodiment and the second embodiment are assigned with identical reference signs and explanation will be omitted.

As illustrated in FIG. 11, the respective light receiving sections 11 include the photoelectric conversion regions 31. Between the respective light receiving sections 11 and the charge transfer unit 13, the storage regions 32 and the shift regions 33 are provided. On the storage region 32, the two storage gate electrodes 35*a* and 35*b* are provided. On the shift region 33, the shift gate electrode 36 is provided.

The storage region 32, the shift region 33, the storage gate electrodes 35*a* and 35*b*, and the shift gate electrode 36 are provided to correspond to each of the photoelectric conversion regions 31, and configurations of these components are the same as the configurations of the second embodiment.

In the charge transfer unit 13, the transfer gate electrodes 14 and 15 and the fixed gate electrodes 16 are provided, and configurations of the channel regions 23 and 24 under the transfer gate electrodes 14 and 15, and the channel region 25 under the fixed gate electrode 16 are the same as the configurations in the first embodiment.

Therefore, according to the present embodiment, the solid-state imaging device that generates the effects of both the first embodiment and the second embodiment can be realized.

In particular, the area of the gate electrodes can be decreased, so that reduction in the charge transfer speed due to increase in the load capacity of the control signal line is suppressed, and power consumption can also be suppressed.

Note that the aforementioned respective embodiments relate to a linear image sensor, but are also applicable to a charge transfer unit in an area image sensor.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A solid-state imaging device including a plurality of light receiving sections, and a charge transfer unit configured to transfer a plurality of charges that are generated in the plurality of light receiving sections, comprising:
   a plurality of first transfer gate electrodes with the respective first transfer gate electrodes placed in the charge transfer unit to correspond to single of the light receiving sections, and a first control signal applied;
   a plurality of second transfer gate electrodes with the respective second transfer gate electrodes placed in the charge transfer unit to correspond to the single light receiving sections, and a second control signal different in phase from the first control signal applied;
   a plurality of first fixed gate electrodes with the respective first fixed gate electrodes placed between the respective first transfer gate electrodes and the respective second transfer gate electrodes corresponding to the single light receiving sections in the charge transfer unit, and a first fixed voltage applied;
   a plurality of storage sections with the respective storage, sections placed adjacently to the single light receiving sections, configured to accumulate the plurality of charges generated in the plurality of light receiving sections;
   a plurality of shift sections provided between the plurality of storage sections and the charge transfer unit, and configured to shift the plurality of charges of the plurality of storage sections to the charge transfer unit;
   a plurality of third transfer gate electrodes with the respective third transfer gate electrodes provided to correspond to the respective storage sections, and a third control signal applied; and
   a plurality of second fixed gate electrodes with the respective second fixed gate electrodes provided to correspond to the respective storage sections, and a second fixed voltage applied.

2. The solid-state imaging device according to claim 1, wherein a potential wider the respective first fixed gate electrodes is deeper than a potential under the respective first transfer gate electrodes to which the first control signal which is low is applied, and is shallower than a potential under the respective second transfer gate electrodes to which the second control signal which is high being applied.

3. The solid-state imaging device according to claim 2, wherein the potential under the respective first fixed gate electrodes is specified by ion implantation into an impurity diffusion region under the respective first fixed gate electrodes, or the first fixed voltage that is applied.

4. The solid-state imaging device according to claim 3, wherein the potential under the respective first transfer gate electrodes and a potential under the respective second transfer gate electrodes are specified by ion implantation into impurity diffusion regions under the respective first transfer gate electrodes and the respective second transfer gate electrodes.

5. The solid-state imaging device according to claim 1, further comprising:
   a plurality of shift sections provided between the plurality of light receiving sections and the charge transfer unit, and configured to shift the plurality of charges to the charge transfer unit from the plurality of light receiving sections.

6. The solid-state imaging device according to claim 1, comprising:
   a plurality of shift gate electrodes provided in the plurality of shift sections, and a fourth control signal applied,
   wherein a potential under the respective shift gate electrodes to which the fourth control signal which is high being applied is deeper than a potential under the respective third transfer gate electrodes to which the third control signal which is low is applied, and shallower than the potential under the second transfer gate electrode of the charge transfer unit to which the second control signal which is high is applied.

7. The solid-state imaging device according to claim 1, wherein the solid-state imaging device is a linear image sensor.

8. A solid-state imaging device including a plurality of light receiving sections, and a charge transfer unit configured to transfer a plurality of charges that are generated in the plurality of light receiving sections, comprising:
   a plurality of storage sections with the respective storage sections placed adjacently to the light receiving sections, configured to accumulate the plurality of charges generated in the plurality of light receiving sections;
   a plurality of shift sections provided between the plurality of storage sections and the charge transfer unit, and configured to shift the plurality of charges of the plurality of storage sections to the charge transfer unit;
   a plurality of first transfer gate electrodes with the respective first transfer gate electrodes provided to correspond to the respective storage sections, and a first control signal applied;
   a plurality of fixed gate electrodes with the respective fixed gate electrodes provided to correspond to the respective storage sections, and a fixed voltage applied; and
   a plurality of shift gate electrodes provided in the plurality of shift sections, and a second control signal applied,
   wherein a potential under the respective shift gate electrodes to which the second control signal which is high being applied is deeper than a potential under the respective first transfer gate electrodes to which the first control signal which is low being applied, and shallower than the potential under a second transfer gate electrode of the charge transfer unit to which the second control signal which is high being applied.

9. The solid-state imaging device according to claim 8, wherein the solid-state imaging device is a linear image sensor.

\* \* \* \* \*